US005120972A

United States Patent [19]

Rangwalla et al.

[11] Patent Number: 5,120,972

[45] Date of Patent: Jun. 9, 1992

[54] METHOD OF AND APPARATUS FOR IMPROVED NITROGEN INERTING OF SURFACES TO BE ELECTRON BEAM IRRADIATED

[75] Inventors: Im J. Rangwalla, N. Andover; Sam Nablo, Lexington, both of Mass.

[73] Assignee: Energy Sciences, Inc., Wilmington, Mass.

[21] Appl. No.: 625,833

[22] Filed: Dec. 11, 1990

[51] Int. Cl.[5] .......... H01J 37/30

[52] U.S. Cl. .......... 250/492.3; 250/398

[58] Field of Search .......... 250/398, 492.3

[56] References Cited

U.S. PATENT DOCUMENTS 3,702,412 11/1972 Quintal .......... 313/299

3,745,396 7/1973 Quintal et al. .......... 313/37

4,143,468 3/1979 Novotny et al. .......... 250/398

4,252,413 2/1981 Nablo .......... 250/310

OTHER PUBLICATIONS

A. Chapiro, "Radiation Chemistry of Polymeric Systems", Inter-Science Publishers, N.Y. (1962), Ch. IV, p. 124.

*Primary Examiner*—Bruce C. Anderson
*Attorney, Agent, or Firm*—Rines and Rines

[57] ABSTRACT

Through the use of a hybrid or the combination of inexpensive relatively impure, and expensive pure, nitrogen purging at various locations of electron-beam processing of polymer and other coatings, high speed efficient processing can be obtained at reduced cost.

15 Claims, 3 Drawing Sheets

Figure 1:
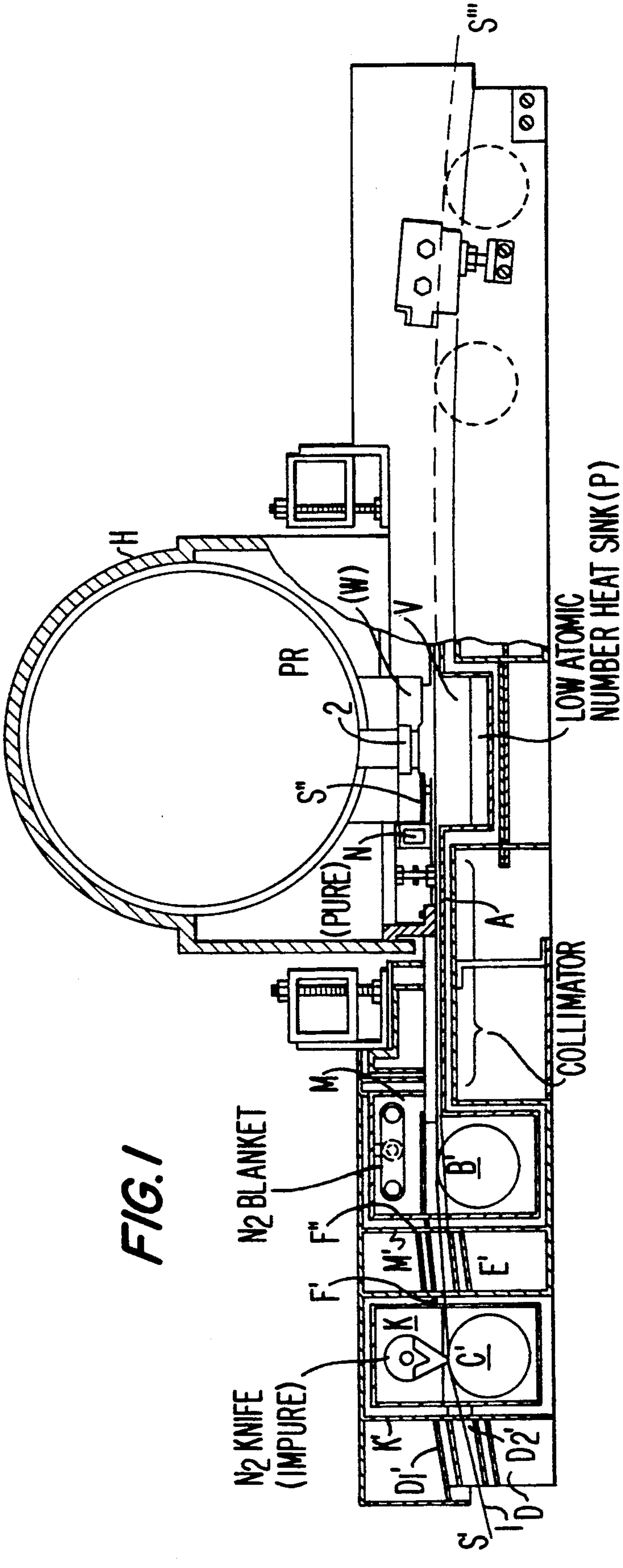

METHOD OF AND APPARATUS FOR IMPROVED NITROGEN INERTING OF SURFACES TO BE ELECTRON BEAM IRRADIATED

The present invention relates to electron beam irradiation apparatus and techniques, and more particularly to the inerting of surfaces-to-be-irradiated, as for the curing of coatings or for other purposes, with the aid of nitrogen gas injected into the apparatus at appropriate regions of the processing.

BACKGROUND

In U.S. Pat. No. 4,252,413 of common assignee herewith, such an electron beam processor is described in which substrate surfaces, as on a web, are passed through a shielded processor, entering at an angle into an inlet or infeed region zone, containing an appropriate collimator system and then passed through a subsequent irradiation treatment, or other processing zone or region, herein sometimes referred to generically as the "curing" region or zone, where electron beam energy is passed through a window of the electron beam generator to impinge upon the surface travelling through the curing or processing zone, and then exiting at an angle in processed state.

Essential to complete curing, for example, of an electron-beam curable or treatable surface being irradiated, is the adequate stripping off of oxygen (or air) layer from the top surface of the substrate before the electron beam irradiates the same in the curing or processing zone. Such oxygen layer, which is inherently carried as a boundary layer with the substrate as it enters the inlet region of the processor, will inhibit the effectiveness and completeness of the electron beam treatment. Oxygen inhibition of free radical initiated polymerization is discussed, for example, in "Radiation Chemistry of Polymeric Systems," A. Chapiro, Inter-Science Publishers, N.Y. (1962), Ch. IV. The inerting of the processor is essential also to eliminate beam-produced ozone and nitrous oxides which can be carried by the product into the work area. Tolerable levels of ozone have been $<0.1$ ppm, requiring sophisticated gas control techniques for high speed processors as used in crosslinking of film or sterilization applications.

Purging of the oxygen barrier has accordingly been standard procedure, as by introducing pressurized pure nitrogen gas from a liquid nitrogen ($LN_2$) supply into the processor treatment zones as described, for example, in said patent. The monitoring of the degree of nitrogen purging, however, by location of a sensor at different regions of the processor still does not really determine the remaining oxygen on the substrate surface where the electron beam impinges on the same; and precise information on tolerable oxygen contaminant at such interface for satisfactory cure or other treatment has been difficult.

These problems have become exacerbated as higher speeds of electron-initiated polymerization of coatings, such as inks, polymers and film, are desired and the inerting must keep pace. The high cost of using pure liquid nitrogen purging is another disturbing factor.

There has been no technique readily available, however, adequately to ascertain inerting efficacy. While one can easily determine if the system permits high speed transport of the product with suitable presentation to the processor without pollution of the workplace, as by determining the concentrations of beam-generated pollutants in the work areas and their dependence on line speed time processor current, etc., this is not, for most electron curing applications, the important criterion. The critical test is whether or not the design provides a suitable inerted environment so that an acceptable degree of cure or treatment, again using these terms interchangeably, can be achieved with a modest treatment level (absorbed dose).

What may constitute an acceptable degree of cure, however, depends heavily upon the end application of the product. If, for example, it is a coating which is in direct contact with a consumable product, or a medical product, or if it is rolled into contact with the material surface that eventually is used in direct food contact, the requirements of cure are severe. This type of application must indeed comply with the requirements of the Code of Federal Regulations (Title 21) in force in the United States, wherein materials which can be extracted from the coating are used as a measure of cure quality.

In accordance with the present invention, an analytical technique has been developed for the optimization of system inerting, and in particular has been used to study the effects of nitrogen gas purity and point(s) of injection in the curing process. In view of the great sensitivity of the g.c. assays of degree of conversion, the technique has been used to determined the efficiencies of using "hybrid" inerting, in which relatively economical but lower purity nitrogen (e.g. 99%) is used as an adjunct to the very high purity (99.999%) but more expensive, cryogenically-produced nitrogen. This invention also teaches the significant process efficiencies which are realized using this combined technique, with no diminution in curing efficacy compared with the use of just the purest nitrogen gas.

OBJECTS OF INVENTION

An object of the present invention, accordingly, is to provide a new and improved method of and apparatus for improved nitrogen inerting of surfaces to be electron-beam irradiated or treated (sometimes generically referred to herein as "cured" or "curing", as previously mentioned) that employs hybrid use of pure and less pure nitrogen gas for such inerting in different zones or regions of the electron-beam processor.

A further object is to provide more effective and less costly inerting particularly at higher speeds of electron-initiated polymerization of coatings such as inks, polymer coatings and films and the like.

Other and further objects will be explained hereinafter and are more particularly delineated in the appended claims.

SUMMARY

In summary, however, from one of its viewpoints, the invention embraces a method of efficiently using a hybrid comprising pure nitrogen and less expensive relatively impure nitrogen to inert the entry and curing zones of electron beam processors through which a substrate is to be passed carrying a coating-to-be-cured by electron beam irradiation in said curing zone, and with substantial independence, within limits, of one or more of line speed of the passage of the substrate through the irradiation zone, nitrogen purity, and degree and quality of coating cure; the method comprising, introducing impure nitrogen as a gaseous knife near the region of entry of the coated substrate, particularly to strip the inherent oxygen-containing (air) boundary layer carried upon the coated substrate entering at the said entry zone of the processor; and only introducing pure nitrogen as from a liquid nitrogen source near the said curing zone.

Preferred and best mode details and designs are hereinafter set forth.

DRAWINGS

Figure 2:
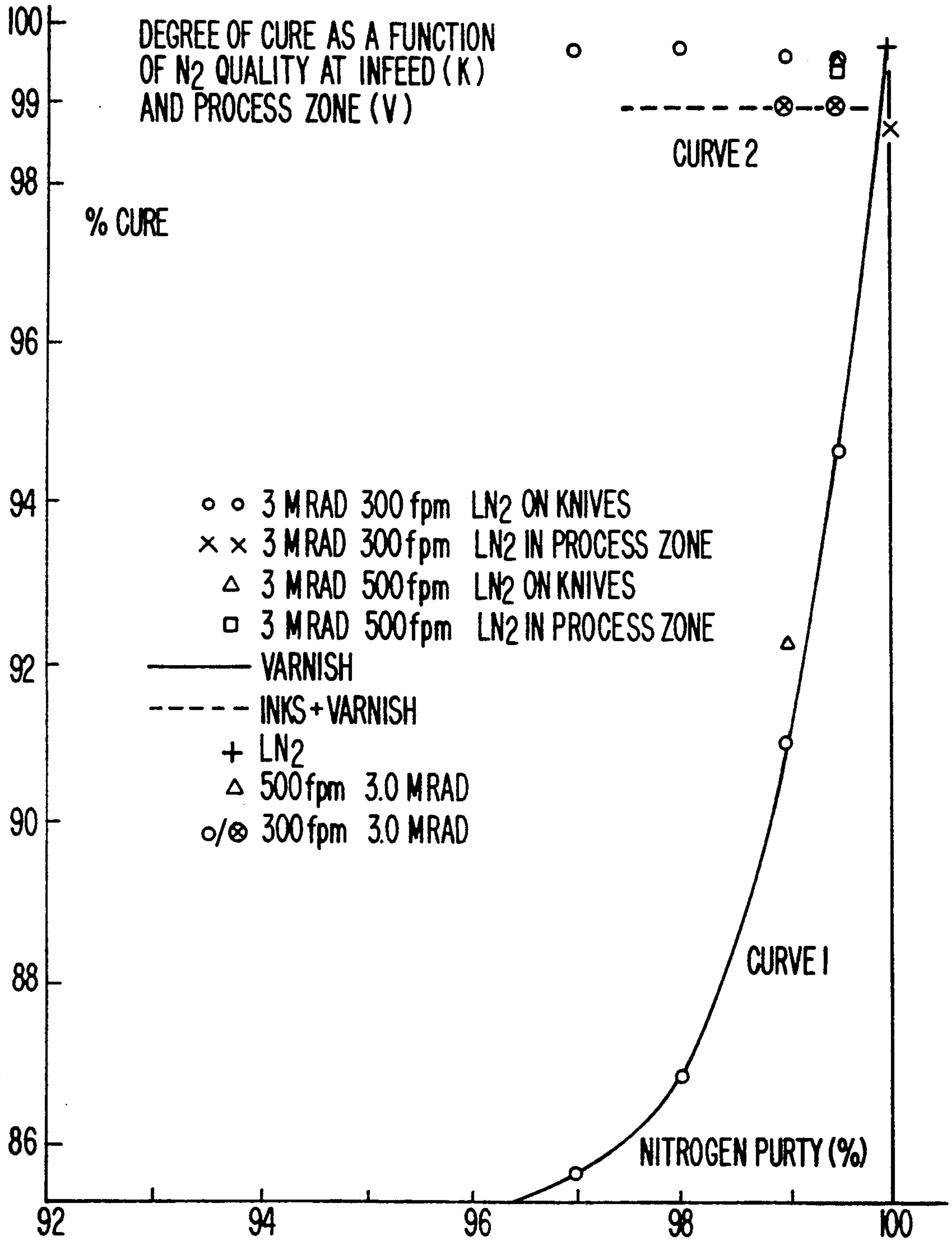
Figure 3:
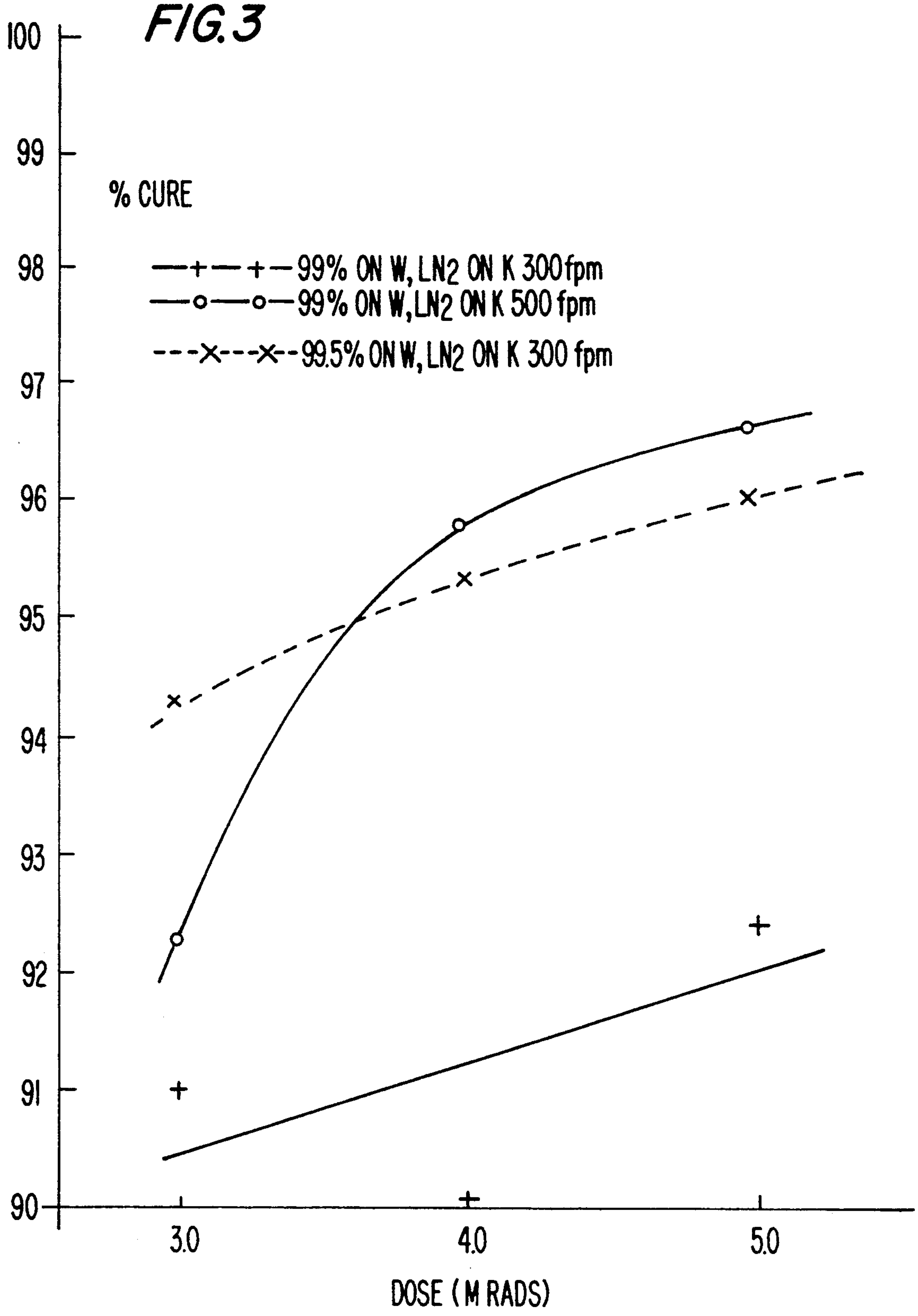

The invention will now be described in connection with the following drawings in which the exemplary or illustrative embodiment of FIG. 1 shows the type of electron beam processor construction described in said U.S. Pat. No. 4,252,413 in which, as in other beam processor configurations, the present invention may be applied; and FIGS. 2 and 3 are experimentally obtained graphs presenting, respectively, degree of coating cure as a function of infeed and process zone nitrogen quality, and cure quality as a function of dose at different speeds with less or impure nitrogen gas on the curing zone window and infeed of the processor.

INVENTION

In the electron processor of FIG. 1, as described in said patent, a web or substrate 1 carrying an upper coating or surface-to-be-irradiated is fed at the infeed region S' into an inlet collimator D having an inclined entrance slot radiation trap defined by upper and lower walls $D_1'$ and $D_2'$ which prevent scattered radiation from escaping at S', continuing over a roll C' in an air or oxygen-stripping inlet cavity region K', having a so-called nitrogen knife K, directed against the coating or upper (or, if desired, lower) substrate surface to strip away the air or oxygen carried by substrate 1 into the processor. The substrate 1 continues from the knife region K' along the further radiation trap passage E' and collimators F'—F" to roll B', where a second small angle change in direction of feed is shown occurring. A distributor or baffled plate M may be used to nitrogen-flood the substrate surface (product surface) before entrance into the irradiation zone V by using such a manifold assembly in cavity M'. Effective inerting can be accomplished by using a sheet metal face over the radiation traps D and E' so that the inerting gas flows at a higher velocity without turbulence over the length of the substrate 1 as it enters the radiation zone V.

The substrate or web then proceeds to the irradiation processing or treatment ("curing") zone or region V via extended horizontal collimator A, passing substantially horizontally at V under an aluminum or other electron-pervious window 2 of the electron beam generator PR within housing H, as of the 100–300 kv type described, for example, in U.S. Pat. Nos. 3,702,412; 3,745,396; and 3,769,600, among others. The processor window 2 faces a radiation cavity trap having a low atomic number heat sink surface P as of aluminum, for example.

As shown, moreover, the inert nitrogen gas may also be admitted from a liquid nitrogen source via manifold N in advance of the slot S" in the hold-down plate of the window 2 in the curing, irradiation or processing zone, permitting gas or convective cooling of the window with effective "pressurization" of the process zone V with the inert gas (enabled by the relatively low conductance of the entrance and exit apertures).

The irradiated or cured surface carried by the substrate or web 1 then exits downwardly at S'''.

Thus, in the system of FIG. 1, in which the incoming web enters the collimated region and changes direction over roller C', over which nitrogen knife K is located, the air boundary layer on the web surface is further rejected from the process zone V by pressurization via nitrogen flow in blanket M and window manifold N. Nitrogen flowing over the window surface 2 at V provides, as before stated, convective cooling of the window foil as well as turbulent flow and pressurization of the collimated zone to the exit slot at S'''.

The level of oxygen present in the process zone may be measured with an oxygen sampler at region A. This is usually performed, however, with a sampling tube in the wall of the collimator A so that it provides little insight into the actual $O_2$ concentration at the surface of the web or Product where the electron-initiated polymerization or like reaction is taking place. Clearly the lifetime of the radical (ionized or excited atom or molecule) initiating the reaction will depend upon the local oxygen concentration, since the propagation of polymerization can be readily terminated by recombination of the radical with molecular oxygen. Other than the indirect techniques used in accordance with the technique of the invention, there is no way of determining the local ($O_2$) oxygen concentration in or at the surface, as, for example, a micron thick coating of interest. Inference as to whether significant levels were present can be obtained, though, from this degree of cure protocol and hence to determine inerting system efficacy.

Referring to FIG. 1, several injection points are provided for the inerting ($N_2$) gas: infeed knives (K), interior baffles (M) prior to the curing zone V and forced convective cooling of the window foils (N). For normal operation in the 50–200 meter per minute product speeds normally encountered in such units, the gas flows Q1 in the infeed knives (K) are comparable to the window cooling ($Q_2$), while the interior baffles (M) are frequently used at lower levels, perhaps 0.5 Q1 or Q2 for standby, and may go to zero in actual operation. Nitrogen gas controlled quality is used in accordance with the invention for injection via flow meters into the gas manifolds provided in designs such as that of FIG. 1.

Trials were conducted on a one meter production system to show the effects of impure gas at K and V on the degree of cure. The tests were typically conducted over the range of $N_2$ gas purities from impure or less pure relatively inexpensive 95% (50,000 ppm $O_2$) to expensive pure 99.999% (10 ppm $O_2$) and in the following manner:

(a) to determine conditions (Q1+Q2) as well as dose and dose rate, offering a degree of cure approaching 100% as with pure nitrogen);

(b) to determine the degree of cure at the same dose and dose rate with pure $N_2$ for Q1 and varying degrees of purity for $Q_2$;

(c) to determine the degree of cure at the same dose and dose rate with pure $N_2$ for Q2 and varying degrees of purity for Q1.

In this manner, the effects of the other two important parameters for curing were eliminated and the impact of $N_2$ purity alone, determined.

The results revealed a totally unexpected dependence upon $N_2$ purity. It had earlier been believed that the controlling factor in the $O_2$ impact on curing would be the purity of gas in the infeed knives K, because they were determining the quality of the web boundary layer and hence the gas environment experienced by the surface coating. This turned out, however, surprisingly not to be the case, as illustrated in FIG. 2, wherein, for the case where the pure nitrogen is fed to the infeed knives K (Q1), the degree of cure dependence on the nitrogen purity in the process zone was found to be very steep (curve 1). However, when the converse case is used, namely pure nitrogen in the process zone V and impure gas supplied to the infeed knives K (Q1), the degree of cure shows no dependence on gas purity down to the 97% point (30,000 ppm), shown in curve 2 of FIG. 2.

It is believed that this effect arises from the very high degree of gas heating and concomitant turbulence in the beam-affected process zone. For example, at the dose rates typically used in these type processors ($10^8$ r/sec or 240 cal/g/sec), the heating rates in $N_2$ are 1,000° C./sec. The turbulence created in the few centimeters of gas immediately above the web leads to rapid exchange in the boundary layer, so that the impact of the infeed knives K (other than for reduction of $O_2$ transport to the process zone) is greatly diminished once the free radicals have been formed in the electron treatment region V (FIG. 1). Similar results are shown in FIG. 2 at higher dose rates (product speeds) where the same behavior was measured at 500 fpm. This behavior indicates that the successful transition from pure air outside the processor (210,000 ppm $O_2$) to the inlet region S' (5-10,000 ppm) to the process zone V (10-100 ppm) is not yet affected by product speed.

The results in FIG. 3, furthermore, show that keeping the absorbed dose the same and pure nitrogen fed into the knives K and with impure $N_2$ in the process zone V provided a higher degree of cure at elevated product speeds (high dose rates) than that at low speeds. Though the reaction kinetics of free radical initiated polymerization reactions teaches that the degree of cure is lower at high dose rates than at lower dose rates, the results of the tests conducted here indicate differently. This work indicates that the polymerization reaction under a heated plasma of nitrogen/oxygen ions is strongly diffusion limited by the diffusion of oxygen from the process zone to the web surface. Because the diffusion time is much greater than the addition polymerization time, a better cure is obtained at higher speeds due to the inability of the inhibiting $O_2$ to diffuse throughout the reacted polymer or other coating.

If the knives are designed to create a truly laminar flow which replaces the air boundary layer carried by the web, for example, with the existing knives as taught in said Patents, one can use pure $LN_2$ just on the knives K and replace the oxygen in the process zone V with cheaper, less pure nitrogen from well established, gas separation processes including pressure-swing adsorption, or membrane technologies.

It is well known that one cannot achieve a high degree of cure for current electron beam coating formulations at $O_2$ concentrations above a few hundred parts per million; hence the need to combine the technique of high quality inerting in the region at and beyond electron treatment. What the results of the present invention have shown is the ability to utilize lower quality $N_2$ upstream in such applications.

The invention thus provides a technique for utilizing $N_2$ or other gases of reduced quality in the infeed zone of an electron processor, with the use of pure $N_2$ only in the process zone. Since current inerting designs require that at least one-half of the inerting flow be provided at the input to the process zone for the control of $O_3$ and $NO_x$ produced by the beam from $O_2$ brought into the process zone by the product, the technique is known to reduce the consumption of pure (usually cryogenically produced) $N_2$ by at least a factor of 2 with an associated cost savings under such conditions of substantially equal nitrogen quantities employed at each zone. The cost of "impure" $N_2$ gas supplied by pressure swing absorption or similar molecular sieve generators (99-97% purity or 10,000 to 30,000 ppm) is, indeed, about one-half that of cryogenically produced (99.999% or 10 ppm) nitrogen.

There may be other applications, moreover, where the hybrid of relatively impure and pure nitrogen purging may be used in other sequences or location; and further modifications will also occur to those skilled in this art —such being considered to fall within the spirit and scope of the invention as defined in the appended claims.

What is claimed is:

1. A method of efficiently applying a hybrid gas injection system using pure nitrogen and less expensive relatively impure nitrogen to inert the entry and curing zones of an electron beam processor through which a substrate is to be passed carrying a coating-to-be-cured by electron beam irradiation in said curing zone, and with substantial independence, within limits, of one or more of speed of the passage of the substrate through said curing zone, nitrogen purity, and degree and quality of coating cure; the method comprising, introducing relatively impure nitrogen having a significant non-inert gaseous impurity content as a gaseous knife near the region of entry of the coated substrate, particularly to strip the oxygen entrained boundary layer carried upon the coated substrate entering at the said entry zone of the processor; and only introducing pure nitrogen as from a liquid nitrogen source near the said curing zone.

2. A method as claimed in claim 1 and in which the pure nitrogen is injected upon the coated substrate prior to reaching said curing zone.

3. A method as claimed in claim 2 and in which the pure nitrogen is also passed over the coated substrate in said curing zone.

4. A method as claimed in claim 1.and in which the limits of nitrogen purity of the relatively impure nitrogen are formed about 90-99%, with the impurity being oxygen.

5. A method of efficiently applying a gaseous hybrid system using pure nitrogen and less expensive relatively impure gaseous nitrogen to inert the entry and curing zones of an electron beam processor through which a substrate is passed carrying a coating-to-be-cured by electron-beam irradiation in said curing zone, that comprises, introducing relatively impure nitrogen having a significant non-inert gaseous impurity content at one region between the said entry and curing zones, and introducing pure nitrogen only at another region separated from the said one region.

6. A method as claimed in claim 5 and in which said one region is near said entry zone and the said introducing thereat is as a gaseous knife directed against the coated substrate carrying an inherent oxygen boundary layer thereupon.

7. A method as claimed in claim 6 and in which said another region is in the vicinity of the said curing zone.

8. A method as claimed in claim 7 and in which said introducing at said another region provides an inerting barrier zone prior to said curing zone.

9. A method as claimed in claim 5 and in which said one region is near said curing zone, and said another region is near said entry zone, with the pure nitrogen being introduced as gaseous knife laminarly stripping off the inherent oxygen boundary layer carried into the entry zone by the coated substrate.

10. A method as claimed in claim 5, and in which the limits of nitrogen purity of the relatively impure nitrogen are from about 90–99%, with the impurity being oxygen.

11. Apparatus for efficiently applying a gaseous hybrid system using pure nitrogen and less expensive relatively impure nitrogen in an electron beam processor having an entry infeed region for receiving a substrate carrying a surface-to-be-irradiated and an irradiation zone at which electron beam radiation is directed upon said surface, the apparatus having, in combination, gaseous knife means disposed near the infeed region and provided with means for introducing nitrogen thereat, particularly to strip the inherent oxygen/air boundary layer carried upon said surface entering the infeed region; means for introducing nitrogen at or near the said irradiation zone; and means supplying pure nitrogen to one of said introducing means and relatively impure nitrogen having a significant non-inert gaseous impurity content to the other of said introducing means.

12. Apparatus as claimed in claim 11 and in which the said supplying means supplies the relatively impure nitrogen to the first-mentioned introducing means and the pure nitrogen as from a liquid nitrogen source to the second-mentioned introducing means.

13. Apparatus as claimed in claim 12 and in which the quantities of nitrogen introduced at said infeed region and at or near said irradiation zone are about equal.

14. Apparatus as claimed in claim 11 and in which means is provided for causing the gaseous knife means to provide substantially laminar boundary layer flow, and the said supplying means supplies the relatively impure nitrogen to the second-mentioned introducing means and the pure nitrogen to the first-mentioned introducing means.

15. Apparatus as claimed in claim 11, and in which the limits of nitrogen purity of the relatively impure nitrogen are from about 90–99%, with the impurity being oxygen.

* * * * *